United States Patent [19]

Tachizawa et al.

[11] 4,222,665

[45] Sep. 16, 1980

[54] LONG-TERM METER-RECORDER FOR SOLAR CELL OUTPUT POWER

[75] Inventors: Hiroshi Tachizawa; Asaji Kawano, both of Tokyo, Japan

[73] Assignee: Nippon Electric Co., Ltd., Tokyo, Japan

[21] Appl. No.: 968,705

[22] Filed: Dec. 12, 1978

[30] Foreign Application Priority Data

Dec. 13, 1977 [JP] Japan ............................... 52-150230

[51] Int. Cl.³ .......................... G01J 1/42; G01R 31/26
[52] U.S. Cl. ................................. 356/218; 73/170 R; 324/158 D
[58] Field of Search .................. 324/113, 158 D, 29.5; 73/170 R; 356/218, 215

[56] References Cited

U.S. PATENT DOCUMENTS 4,168,124  9/1979  Pizzi ..................................... 356/218

OTHER PUBLICATIONS

"Solar Cell Test Data Processing System"; 5 pages; Spectrolab, Sylmar, California.

Primary Examiner—Ernest F. Karlsen
Attorney, Agent, or Firm—Sughrue, Rothwell, Mion, Zinn and Macpeak

[57] ABSTRACT

A low power consumption solar cell meter-recorder capable of measuring the output power of a solar cell and recording the measured data and the date of measurement, all at a remote location using only battery power, is disclosed. The voltage output of the solar cell is converted into a frequency which is counted over a predetermined time to produce the measured data. The measured data is stored in a first address section of a memory. Digital date information is generated and stored in a second address section of the memory. Both the first and the second address sections are addressed by the same address number. When a read out is desired, the measured data and date stored in the memory are displayed.

4 Claims, 3 Drawing Figures

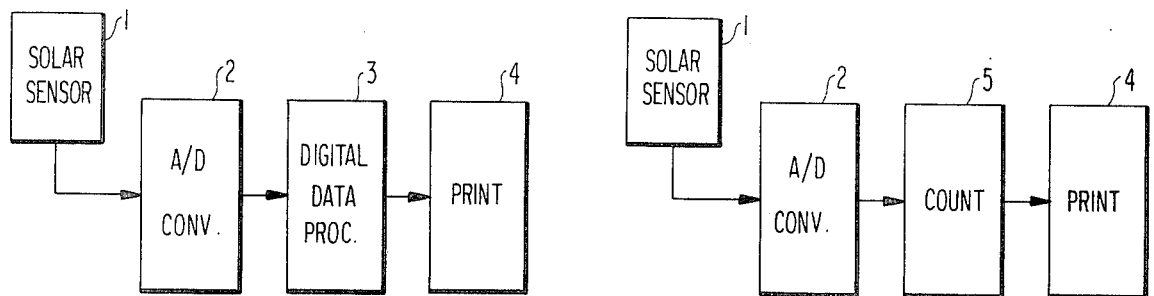
FIG 1 PRIOR ART
FIG 2 PRIOR ART
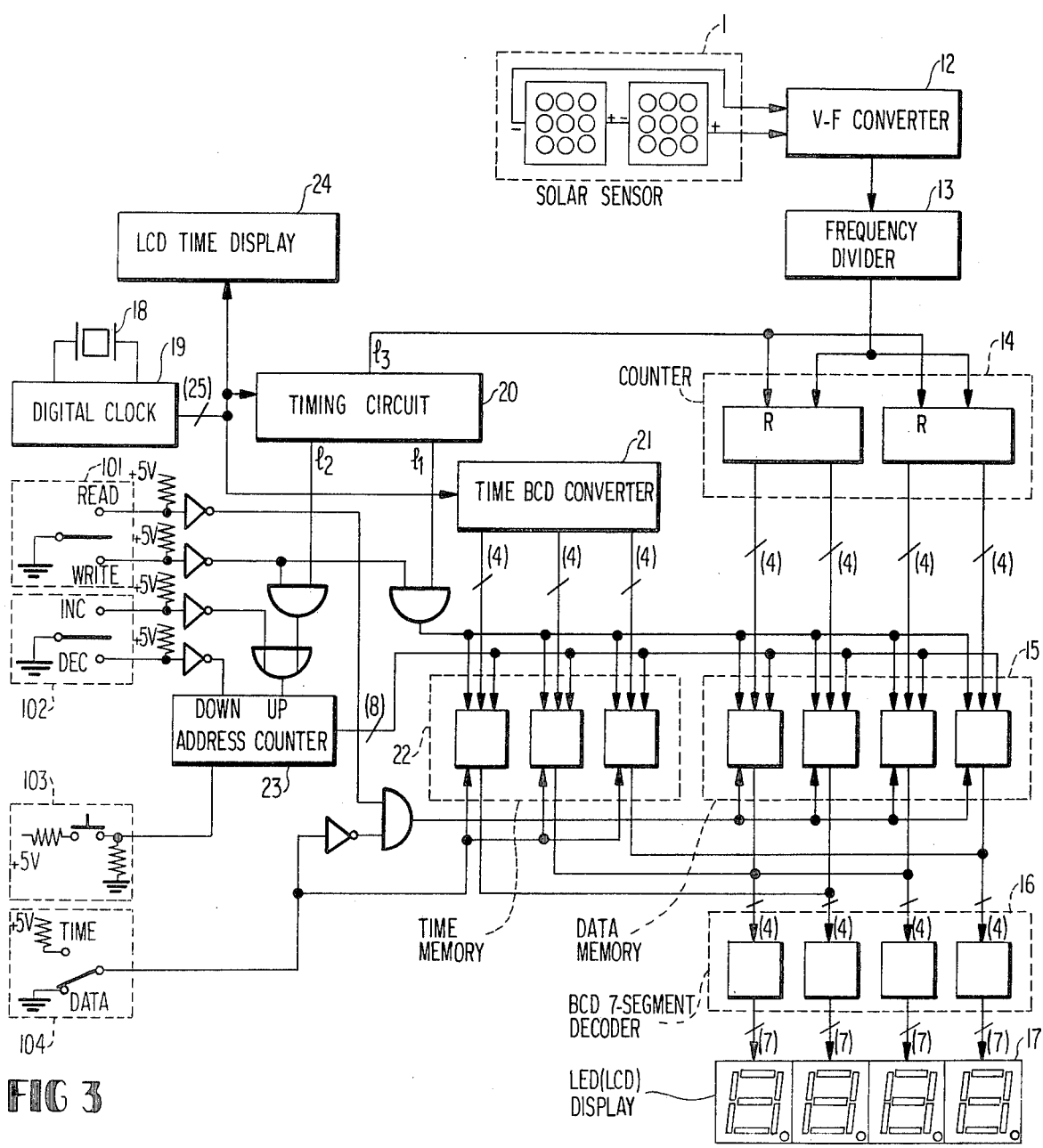
FIG 3

LONG-TERM METER-RECORDER FOR SOLAR CELL OUTPUT POWER

BACKGROUND OF THE INVENTION

The present invention relates to a meter-recorder for measuring output power of a solar cell over a long term and recording the measured data.

Microwave repeater stations are normally located at mountain tops or high lands for securing a line-of-sight between the respective stations. Such locations are usually very far from a power line of a commercial power source, and often encounter difficulties in power supply. Accordingly, with regard to the communication apparatuses to be installed at such remote places, it has been strongly required to minimize power consumption so that the power may be supplied by a solar cell arrangement. While a power supply employing a solar cell arrangement is constructed of a number of solar cells and a storage battery, the output power of the solar cell arrangement, i.e., the magnitude of the effective light reception area of the solar cell arrangement must be determined depending upon an average sunshine time and insolation intensity over a year or a comparable period of time in the neighborhood of the communication station site and upon power consumption of the entire communication apparatuses at the station. In other words, if the effective light reception area of the solar cell arrangement is made large enough, the solar cell can supply the required power even if the sunshine time and the insolation intensity are insufficient, but the manufacturing cost of the solar cell arrangement becomes extremely high. On the contrary, if the effective light reception area of the solar cell arrangement is made too small, the power supply to the communication apparatuses becomes insufficient when the sunshine time is reduced, driving the communication apparatuses out of operation. Accordingly, it is necessary to acquire data on the sunshine condition in the neighborhood of the communication station site over a long term and to preset the capacities of the solar cell and the storage battery at optimum values on the basis of the acquired data.

Measurement of output power of a solar cell is carried out in terms of an accumulated value for one day of solar energy irradiating a horizontal area of 1 square-centimeter ($cm^2$) at a measuring point (Langley value). Such type of apparatus is described, for example, in a catalogue titled "Solar Cell Test Data Processing System" distributed from SPECTROLAB, Sylmar, California, U.S.A. This system comprises a data acquisition section for acquiring data such as output power of a solar cell of the like, a data processing section containing a computer for processing the acquired data and a printer or the like for recording the processed data. While this system can assure a high precision of measurement and provide readily available data, it requires a commercial power supply because of large power consumption, so that it is not suitable as a measuring apparatus to be operated at remote places where such a commercial power supply is not available. In order to overcome this difficulty, various methods have been proposed such as modifying the printer into an impact type to reduce power consumption, recording an output voltage of a solar sensor directly on a recording web in ink, or recording it on a black scratch film with a diamond stylus. However, the recording on a web by an impact shot or in ink is not suitable for long-term measurement and recording because of the need for supplement of a new inked ribbon and ink. Furthermore, in the apparatus for directly recording an output voltage of a solar sensor, a graph showing the insolation intensity and recorded on the recording web cannot be utilized directly but it must be converted into Langley values.

SUMMARY OF THE INVENTION

Therefore, it is an object of the present invention to provide a meter-recorder for solar cell output power which can record a total amount of irradiated solar energy for each intended measuring day over a long term, which makes it possible to directly read the measured value for each intended measuring day and which has extremely reduced power consumption.

According to one feature of the present invention, there is provided a meter-recorder for solar cell output power which measures output power of a solar cell and records the measured data and the date of the measurement, comprising first means for converting the irradiation intensity of solar rays into a voltage, second means for converting the converted voltage into a frequency, third means for counting the converted frequency over a predetermined period to produce measured data, fourth means for storing the measured data in a first address section, fifth means for generating a digital date information, sixth means for storing the digital date information in a second address section, seventh means for providing a first control signal to designate the predetermined period and a second control signal to designate an address number in the first and second address section so that the measured data and the date of the measurement may be stored respectively in the same number of addresses in the first and second address sections, and eighth means for displaying either the measured data or the date of the measurement in the fourth or sixth means, respectively.

BRIEF DESCRIPTION OF THE DRAWINGS

Now the present invention will be described in greater detail with reference to the accompanying drawings, in which:

FIGS. 1 and 2 are schematic block diagrams of a conventional meter-recorder for solar cell output power; and FIG. 3 is a block diagram of one preferred embodiment of the present invention.

DESCRIPTION OF THE PRIOR ART

Referring now to FIG. 1, an irradiation intensity of solar rays is converted into a voltage by a solar sensor 1, and the voltage is further converted into a digital value by an A-D converter 2. In a digital data processing section 3, the digital value is processed in the form of a measured value at every ten minutes or a value accumulated over one day and is supplied to a printer 4. Then, the supplied information is printed out by the printer 4. This apparatus is mainly used in a meteorological observation station, and usually an A.C. commercial power supply is used as a power source. The solar sensor 1 may be made of a SPECTROSUN Model SR-70 radiometer of a SPECTROSUM Model SR-75 pyranometer made and marketed by SPECTROLAB, Sylmar, California, U.S.A.

In the meter-recorder shown in FIG. 2, the operations of the structural elements up to the A-D converter 2 are identical to those of the apparatus shown in FIG.

1. The output of the A-D converter 2 is counted up by a counter 5, and at a time designated by a timer 6, the content in the counter 5 is printed out and recorded as a datum by a printer 4. These apparatuses shown in FIGS. 1 and 2 have large power consumption because of the use of a printer, and especially the apparatus shown in FIG. 2 makes use of both A.C. and D.C. power sources, so that it has a disadvantage that it cannot be used as a meter-recorder at a location where a commercial power supply is not available.

DESCRIPTION OF THE PREFERRED EMBODIMENT

FIG. 3 shows one preferred embodiment of the present invention adapted to record an accumulated value of irradiated solar energy over one day for each intended measuring day. In this figure, reference numeral 1 designates a solar sensor; 12, a voltage-frequency (V-F) converter (for example, Model RM4151 manufactured by Raytheon); 13, a frequency-divider (for example, Model CD4059 manufactured by RCA); and 14, a 4-digit counter (for example, Model MC14518B manufactured by Motorola). Numerals 15 and 22, respectively, designate a data and time memory of 4 bytes (32 bits) in width and 256 bits in length (for example, Model MB5101 manufactured by Intel); 16, a Binary-Coded Decimal (BCD) 7-segment decoder (for example, Model MC14511BCP manufactured by Motorola); and 17, a data/date display section. Numeral 18 designates crystal resonator; 19, an IC (integrated circuit) for digital watches (for example, Model µPD844G manufactured by NEC); 20, a timing circuit; and 21, a circuit for converting a time into a BCD code. Numeral 23 designates an address counter; 24, a Liquid Crystal Display (LCD) display section; 101, a switch for designating an either write or read mode of the memories 15 and 22; 102, a doublethrow momentary switch for designating the address in the address counter 23; 103, a reset switch for the address counter 23; and 104, a switch for selecting a display of either the memory 15 or 22.

An irradiation intensity of solar rays is converted into a voltage proportional to the irradiation intensity by the solar sensor 1 (its specification being for example, 8 V×0.1 A) including small solar cells (each providing an output voltage, for example, of 0.442 V). The output of the solar sensor 1 is converted into a pulse signal having a frequency proportional to the output voltage by the converter 12. This pulse signal is divided in frequency by the frequency-divider 13. The frequency-division is effected in such manner that when solar rays with a standard irradiation intensity (100 mW/cm$^2$) irradiate the solar sensor 1 at right angles (the output voltage of the sensor 1 being then adjusted at 4 V), the pulse frequency may have a value of 4000 PPS (pulse per second). The number of pulses in the output of the frequency-divider 13 is counted up over a period of one day by the counter 14. This count naturally represents the total amount of the irradiated solar energy in one day. The content in the counter 14 is stored as measured data at a predetermined address in the data memory 15. Taking it into consideration that the total amount of irradiated solar energy in one day would not exceed 999 Langleys, the memory 15 can be constituted of a memory of 2 bytes for 4 decimal digits to store the data down to the first order under the decimal point.

On the other hand, for the purpose of exactly making the measured data correspond to the date of measurement, the date information generated by the crystal resonator 18 is also stored simultaneously. More particularly, the data information furnished from the IC for digital watches 19 that is synchronized with the crystal resonator 18 is converted into a BCD code by the BCD code converter 21, and is stored in the time memory 22. This time memory 22 comprises three 4-bit memories to store the digits of date such as 10 (month) and 15 (day).

During the above-described measurement of the data and the date, the switch 101 is connected to a write side (WRITE), and the switch 102 is kept floating. Upon writing of the data and date in the memories 15 and 22, a pulse for temporarily bringing these memories 15 and 22 into a write mode is fed from the timing circuit 20 via a connection line $l_1$ to these memories. After completion of writing in the memories 15 and 22, this timing circuit 20 feeds a pulse for advancing the addresses in these memories by one step to the address counter 23 through a connection line $l_2$. Furthermore, the timing circuit 20 feeds a pulse for resetting the counter 14 at night when there is no irradiated solar energy input during a predetermined period (in this preferred embodiment, one day) through a connection line $l_3$. Accordingly, in response to the operation of the timing circuit 20, an accumulated value of an irradiated solar energy in one day is stored in the data memory 15, and at the same time the date of the measurement is stored in the time memory 22. This timing circuit 20 is supplied with a date information from the IC for digital watches 19 to produce all the timing signals. It is to be noted that the timing circuit 20 can be constructed of a combination of many simple IC's such as AND circuits, OR circuits and flip-flops.

In order to read the memory contents from the data memory 15 and the time memory 22, at first the switch 104 is connected to either a DATA side or a TIME side to suppress the output of the memory which need not be read among the data memory 15 and the time memory 22. Next, when the switch 101 is connected to a READ side, the contents of the data memory 15 or the time memory 22 are converted into a decimal number by the BCD 7-segment decoder 16, and displayed on a display section 17 employing an LCD (liquid crystal display) or an LED (light emitting display). The address designation upon this reading is effected by the switches 102 and 103. More particularly, in order to read the memories from the first address, the switch 103 is connected to reset the address counter 23. Then the switch 102 is connected to an increase side (INC) to step up the address one by one, thereby allowing the data or the date to by successively read out. If it is desired to reduce the address number, it is only necessary to connect the switch 102 to a decrease side (DEC).

The memories 15 and 22 are formed of RAM's (random access memories). Although an RAM has a risk that its memory contents may disappear if the power supply is switched off, this can be avoided by providing back-up dry cells. It is to be noted that a RAM requires a current of 1 mA during a normal operation and about 2 mA upon writing.

Since the memory capacity of the memories 15 and 22 which have stored the data and the date in the above-described manner is 256 bits, it is possible to carry out measurement over 256 days at the maximum, and if read out is made within 256 days, the desired data and date can be obtained. It is a matter of course that if the capacity of the memories is increased, then measurement and recording over a further extended period would become possible.

The required electric power in the above-described embodiment is about 9 V×12 mA for the entire apparatus during a normal operation. Even the value of electric power upon reading by making use of an LED as the display 17 is only about 9 V×15 mA. If an LCD is used as the display 17, the necessary electric power is not different from that during the normal operation.

It is to be noted that the present invention makes it possible to isolate the display section from the meter-recorder section, and to perform reading by bringing the display section to the location of measuring only upon reading or to equip the display section at a separate location.

As described above, according to the present invention a printer is not used but accumulated data are stored in a semiconductor memory having a low power consumption and are displayed on a low power consumption display section, so that the power consumption of the entire apparatus is reduced to one-third or less with respect to the above-described meter-recorders in the prior art. In addition, since structural elements liable to affect the reliability such as a printer or a pen recorder are not used, a high reliability can be assured by the present meter-recorder.

What is claimed is:

1. A meter-recorder for solar cell output power which measures output power of a solar cell and records the measured data and the date of the measurement, comprising:

first means for converting an irradiation intensity of solar rays into a voltage;
    second means for converting the converted voltage into a frequency;
    third means for counting the converted frequency over a predetermined period to produce measured data;
    fourth means for storing said measured data in a first address section;
    fifth means for generating a digital date information;
    sixth means for storing said digital date information in a second address section;
    seventh means for providing a first control signal to designate said predetermined period, and a second control signal to designate an address number in said first and second address sections so that the measured data and the date of the measurement may be stored respectively in the same number of addresses in said first and second address sections; and
    eighth means for displaying either the measured data or the date of the measurement in said fourth or sixth means, respectively.

2. A meter-recorder as recited in claim 1 wherein said fourth and sixth means are random access memories.

3. A meter-recorder as recited in claim 1 wherein said eighth means includes switch means for controlling the display of the measured data and date of measurement only on command.

4. A meter-recorder as recited in claim 3 wherein said eighth means further includes a decoder and segment display operable only on command by said switch means.

* * * * *

UNITED STATES PATENT AND TRADEMARK OFFICE
CERTIFICATE OF CORRECTION

PATENT NO. : 4,222,665
DATED : September 16, 1980
INVENTOR(S) : TACHIZAWA et al.

It is certified that error appears in the above—identified patent and that said Letters Patent is hereby corrected as shown below:

Column 4, line 3, delete "data" and insert -- date -- .

Signed and Sealed this

Third Day of March 1981

[SEAL]

Attest:

RENE D. TEGTMEYER

Attesting Officer     Acting Commissioner of Patents and Trademarks